United States Patent [19]

Luetzow

[11] 4,114,008
[45] Sep. 12, 1978

[54] RELAY SEAL CAP

[75] Inventor: Edwin J. Luetzow, Northfield, Minn.

[73] Assignee: TelTec, Incorporated, Farmington, Minn.

[21] Appl. No.: 695,514

[22] Filed: Jun. 14, 1976

[51] Int. Cl.$^2$ ............................................. H01R 9/04
[52] U.S. Cl. ................................ 29/630 B; 174/50.62; 264/248; 339/218 R
[58] Field of Search .................... 200/302; 174/50.62; 264/248; 339/218 M, 198 R, 218 R; 335/128; 29/629, 630 B

[56] References Cited

U.S. PATENT DOCUMENTS 3,906,416  9/1975  Sprando ............................ 335/128

FOREIGN PATENT DOCUMENTS 972,441  8/1975  Canada .............................. 339/218 M Primary Examiner—J. V. Truhe
Assistant Examiner—D. A. Tone
Attorney, Agent, or Firm—Orrin M. Haugen; Thomas J. Nikolai

[57] ABSTRACT

A sealed enclosure means for an electrical switching array and a method of preparing such an enclosure, with the switching array employing a plurality of generally rigid terminal contact pins which extend outwardly from a wall of the enclosure. The wall through which the terminal contact pins extend has a plurality of slots formed therein, with the slots having contact pin engaging edges. The material from which the wall is fabricated through which the terminal contact pins extend is generally resilient, and the slots which are formed therein to receive the contact pins have a width which is less than the pin thickness so as to cause the slot edges to temporarily form a lip seal about the surface of the pin. The terminal contact pins are then heated so as to cause the thermoplastic resilient material to flow to form a seal about the periphery of the contact pin. The temporary lip seal protects the structure against intrusions of solder flux which is used in preparation for the solder dip operation, while the subsequently formed seal (due to flow of thermoplastic material) protects against intrusions of cleaning solvents and the like which are utilized subsequently to remove the residual solder flux.

4 Claims, 5 Drawing Figures

RELAY SEAL CAP

BACKGROUND OF THE INVENTION

The present invention relates generally to a sealed enclosure means for electrical switching assemblies, and more particularly to a sealed enclosure means which is particularly adapted for use in electrical switching or relay assemblies utilizing a plurality of generally rigid contact pins or terminals which extend outwardly from a wall of the enclosure. In their typical application, switching assemblies or relays are preferably sealed so as to be free of environmental or ambient contamination, such as contamination from dust, dirt, temporary exposure to corrosive environments such as solder flux and the like. The sealed enclosure means of the present invention, while not intended to be a hermetic seal, nevertheless provides adequate protection against those environments to which conventional relays or switching assemblies are exposed, particularly during production and assembly into finished systems and/or subassemblies.

Electrical switching assemblies and relays are widely employed in the communications industry, as well as in other industries. Normally these devices are utilized in high volume, and in order to provide for reasonable lifetime, it is desired that the devices be protected from adverse affect of normal environments or ambience, such as protection from exposure to dust ladened air, temporary exposure to corrosive gases, or the like. Normally, these relays and switching assemblies are employed indoors, or housed within larger enclosures so as to be reasonably protected from extreme environmental conditions. Nevertheless, however, constant exposure to dust ladened air and the like can result in a reduction in the lifetime of the relays or assemblies unless protective measures are taken. The present invention makes it possible to provide sealed assemblies, and furthermore this protection is available without exposing the structures to the in-flow of solder flux during final assembly of the devices into a completed system or sub-assembly.

SUMMARY OF THE INVENTION

In accordance with the present invention, a sealed enclosure means is provided for electrical switching or relay assemblies which provides for adequate protection against exposure to normal production hazards and to normal environmental ambience. The sealed enclosure is readily and easily fabricated, and is normally finally sealed upon exposure of the terminals or contact pins to a solder bath or other source of thermal energy. Basically, the sealed enclosures are formed with at least one wall having the contact pins or terminal pins extending outwardly therefrom, and controlled openings are provided in this wall to initially firmly grip the terminal contact pins mechanically and develop a sealed enclosure upon exposure to heat, such as during soldering. The pin sealing wall is preferably fabricated from a thermoplastic material such as nylon, polypropylene, polyethylene, polystyrene, or the like, with these materials being particularly preferred because of their natural resilient characteristic.

The wall through which the contact pins or terminals pass has sufficient thickness so as to have a blind hole or bore formed therein which is, in effect, a guiding bore for the contact pin, with the base or bottom of the bore having the slot formed therein, and with contact pin engaging edges being disposed around the slot. The base of the bore is tapered so that the slot is essentially at the apex of the taper, thus providing a feathered edge which provides a lip seal about the pin, and thus enhances the sealing characteristic of the structure pending final flow and seal of the thermoplastic wall.

Briefly, in order to seal the enclosure, the heat which is available to the terminal pin through a conventional wave-soldering operation or other similar exposure to heat is normally adequate to cause the plastic material forming the lip seal to flow, and thereby ultimately form a seal which sealingly engages the periphery of the terminal contact pin which extends therethrough, thereby eliminating or substantially reducing any intrusion of solder flux during the soldering operation, or intrusion of cleaning solvents subsequent to the soldering operation.

Therefore, it is a primary object of the present invention to provide an improved seal enclosure means for electrical relays or switching assemblies which provides protection to the components within the enclosure from normal exposure to soldering flux and cleaning solvents, and thereafter protection against the environmental ambience.

It is a further object of the present invention to provide an improved sealed enclosure means which employs a wall having rigid terminal contact pins extending therethrough, with the wall being fabricated from resilient thermoplastic material, and with a slot being formed in the wall for engaging the surface of the contact pins, and with the heating of the contact pin causing the resilient thermoplastic material to flow to form a seal about the periphery of the contact pin.

Other and further objects of the present invention will become apparent to those skilled in the art upon a study of the following specification, appended claims, and accompanying drawing.

DESCRIPTION OF THE PREFERRED EMBODIMENT

In accordance with the preferred embodiment of the present invention, the sealed enclosure means generally designated 10 which is arranged for housing electrical switching relays or assemblies comprises a housing having opposed end walls such as end wall 11, a plurality of side walls such as side walls 12 and 13, along with a second end wall 14. As is apparent in the structure, rigid terminal contact pins or terminals pass through the bottom wall 14 and are illustrated at 15—15, and also at 16—16. It will be appreciated that terminal contact pins 15—15 and 16—16 are conventional in the art, and for purposes of this disclosure, pins 15—15 will typically have a rectangular configuration with dimensions of 0.008 inch by 0.025 inch, with pins 16—16 being larger with a square cross-section with sides having a dimension of 0.025 inch. These dimensions are typical for contact terminals or contact pins widely employed in relays and switching assemblies commonly applied in the communications and related industries.

Figure 1:
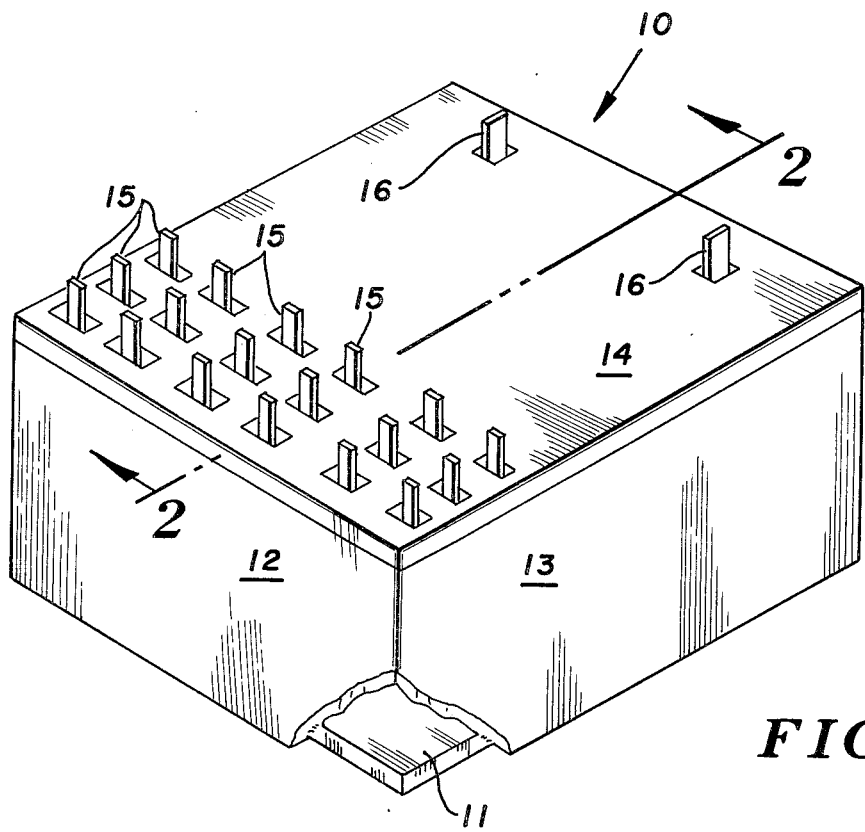
FIG. 1 is a perspective view of a sealed enclosure means prepared in accordance with the present invention, and illustrating the structure with rigid contact pins extending through one of the walls of the enclosure, and with the walls sealingly engaging the contact pins about their periphery.
Figure 2:
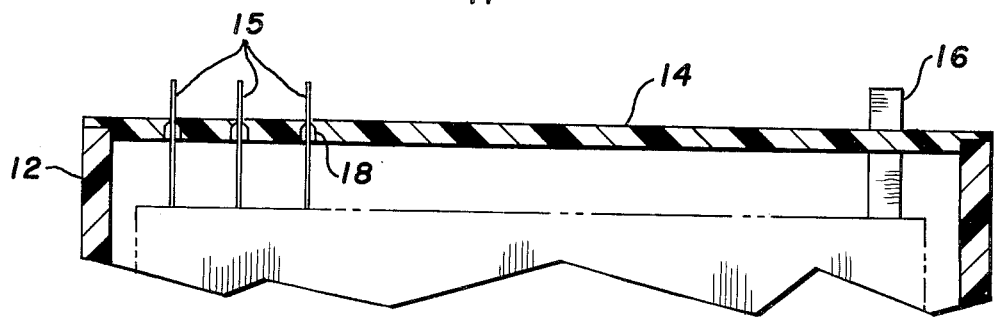
FIG. 2 is a vertical sectional view taken along the line and in the direction of the arrows 2—2 of FIG. 1, with the view illustrating in detail the seals as closed about the periphery of the contact pins, and with a portion of the structure including the electrical relays or switching assemblies being broken away.
Figure 3:
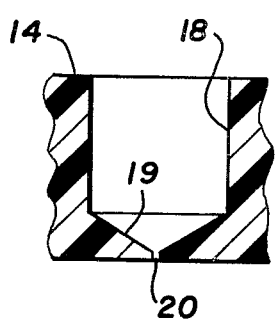
FIG. 3 is a fragmentary sectional view of a bore formed in the wall of the enclosure through which the contact pins pass, with FIG. 3 being shown on an enlarged scale.

As has been indicated, end wall 14 has been provided with a plurality of blind holes or bores which extend part way through the cross-sectional thickness of the wall. These bores are illustrated, for example, in detail in FIGS. 3-5, and are also illustrated in smaller scale in FIG. 2. Typically, a bore such as bore 18 has guide walls formed therealong, with a bore or blind bottom being illustrated at 19. The base 19 of bore 18 is tapered, as indicated, and terminates at a slotted opening as at 20, which, for purposes of illustration, is shown with a dimension. Slotted opening 20 is, therefore, disposed at the apex of the tapering walls forming the bottom 19 of bore 18. Typically, the configuration of bore 18 is rectangular, with the slot being of the order of 0.100 inch in length. For contact pins or terminals having relatively small cross-sectional dimensions, the "slot" will merely be a lanced opening, of "zero" dimension. However, for larger pins or terminals having substantially greater cross-sectional dimensions, the slot which is formed in the material will have a dimension suitable for accommodating the larger cross-sectional pins. A slot of zero width dimension is normally adequate for sealingly engaging contact pins or terminals having cross-sectional dimensions of 0.008 inch by 0.025 inch, up to dimensions of 0.025 inch by 0.025 inch. It is important that the slot width be matched to the cross-sectional width of the contact pin. In each instance, therefore, it is necessary that a lip seal be formed with the wall material against the surface of the pin so as to provide mechanical protection against intrusion of solder flux prior to the forming of an actual seal by virtue of the softening and combined flowing of the thermoplastic material forming the end wall 14, with this subsequent softening and flowing actually functioning to form a seal zone about the periphery of the pin. In certain applications, it may also be desirable or helpful to form a small pierced opening such as a circular hole or the like which limits, to a certain extent, the amount of the wall material which must be physically deformed in order to accommodate passage of the body of the pin therethrough.

The various aspects of the present invention have found application and utility in use with contact pins having a variety of cross-sectional configurations and dimensions. While the preceding discussion has dealt primarily with pins of rectangular or square cross-sections, it will be appreciated that the invention has application and utility when applied to contact pins of other cross-sectional configurations, including, for example, pins of circular configuration as well as hexagonal configuration. In other words, the arrangement is applicable and finds utility in connection with those types of pins which may be passed through a sealing wall having a thickness dimension for accommodating the pins.

Normally, the contact pins which are used will be pre-coated as is conventional in those contact pins which are commercially available. The pre-tinned contact pins have been found, of course, to function extremely well in forming a useful mating seal with the thermoplastic material from which the wall structure is formed. It is not essential, however, that pre-tinned materials be utilized since non-tinned contact pins may be effectively utilized.

The material of construction for wall 14 is preferably a thermoplastic material selected from the group consisting of nylon, polypropylene, polyethylene, and polystyrene. It will be appreciated that other thermoplastic materials may be employed with good results, however the above materials have been found useful and perform well for their intended purposes. Generally speaking, nylon such as Nylon 6, has been found highly desirable, it being appreciated, of course, that other nylons may be employed such as Nylon 66, 611, Nylon 8, or various alloys thereof. Polyethylene and polypropylene are also desired for their resilient characteristics and durability.

Figure 4:
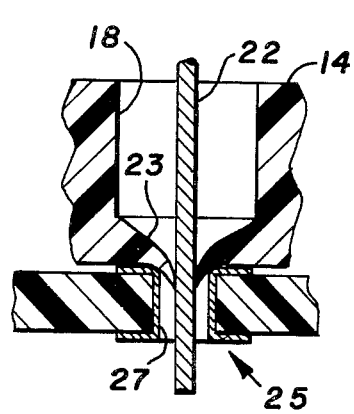
FIG. 4 is a view similar to FIG. 3, and illustrating the appearance of the fragmentary portion of the device with a contact pin extending therethrough.
Figure 5:
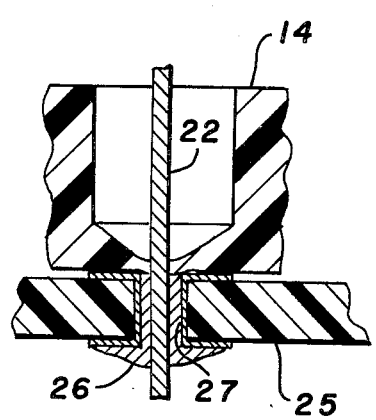
FIG. 5 is a view similar to FIG. 3, and illustrating the device following heating of the contact pin and ultimate flow of the resilient thermoplastic material so as to form a seal about the periphery of the contact pin.

As is apparent in the view of FIG. 4, when contact pin such as pin 22 is passed through the slot 20, the feathered edges of the base portion of the bore which form the edges of the slot 20 are distended outwardly and thus form a lip seal as at 23 about the opposed surfaces of contact pin or terminal 22. At this point, the seal is in mechanical or partially completed form, and is not finished or completed until pin 22 has been exposed to a relatively high temperature so as to cause the plastic material to flow and thereby form a finished seal, such as is illustrated in FIG. 5. In the arrangement illustrated in FIG. 5, the outer free edge of terminal pin 22 has been exposed to a wave soldering bath, with the solder being caused to flow within the hole formed in circuit board panel generally designated 25, such as the solder material 26 confined within the plated through hole 27 of circuit board 25. Heat from the soldering operation closes the opening and forms a seal prior to any intrusion of soldering flux present during the solder dip operation. Thereafter, the thermoplastic seal acts to protect the structure against flow during solvent cleaning operations.

It will be appreciated, of course, that other operations may be employed to heat the terminal pin and thus cause the plastic to flow to form a seal. It is desirable, of course, for purposes of expediting processing, that the soldering operation be utilized as the exposure to a source of thermal energy of sufficient intensity to cause the thermoplastic material to flow and thus complete the seal about the surface of the terminal pin.

Generally, the seal enclosure means of the present invention is provided for electrical switching assemblies or relays, and, as indicated, is not intended to provide a hermetic seal. For most purposes, however, and for general application and use, the sealed enclosure means provides a seal which is resistant to dust or other conditions frequently found in environmental ambience. Also, occasional short duration exposure to corrosive atmospheres may resistent tolerated, as well as a short term exposure to corrosive fluids such as salt-spray or the like.

As a further feature of the arrangement, it has been indicated that the portion of the structure forming the base of the bore 18 is tapered, with an angular taper of approximately 30° being found to be highly desirable from the standpoint of universal application. An angle of 30° provides desired feathered edges, which may flow well upon exposure of the contact pin to a source of high temperature such as is encountered in a conventional wave soldering bath. It will be appreciated, of course, that wave soldering baths are typically maintained at a temperature of approximately 380° F., and for such an exposure, immersion time of the pin adjacent the lip seal should be of the order of 3-10 seconds, although somewhat shorter or longer time periods may be utilized if desired and useful. The angular taper, therefore, is one which provides guidance for the pin during its travel through the wall, but, and perhaps more importantly, provides a bulk or volume of thermoplastic material which will assist in the ultimate formation of a finished seal from the lip seal formed during passage of the contact pin therethrough. Therefore, it will be appreciated that angular tapers other than 30° may be found useful for certain combinations of pin geometry and wall thickness.

I claim:

1. A method of sealing generally rigid rectangular cross-sectioned contact pins within an enclosure wall having an interior surface and an exterior surface which comprises the steps of:
   (a) forming at least one contact pin receiving bore within a thermoplastic enclosure wall, said bore being generally cylindrical and extending for a predetermined distance into said wall from said interior surface and having a frustro-conical end thereon terminating a second predetermined distance short of the exterior surface of said wall, there being a slotted opening, having a transverse dimension less than the corresponding transverse dimension of the contact pin to be received therethrough, extending from the vertex of said frustro-conical end of said bore to said exterior surface of said wall;
   (b) inserting a generally rigid contact pin into said bore with a portion thereof extending through said slotted opening beyond said exterior surface of said wall, with the edges of said slotted opening being in resilient engagement with the lateral edges of said generally rigid contact pin to form a lip seal thereabout; and
   (c) heating said generally rigid contact pin extension to a temperature sufficient to cause the material forming said thermoplastic wall to flow, thereby forming a seal about the edges of said generally rigid contact pin.

2. The method as in claim 1 and characterized in that the taper of said frustro-conical end of said bore is at an angle of approximately 30° to the exterior surface of said wall.

3. The method as in claim 1 and characterized in that the slotted opening is a zero clearance opening.

4. A method of sealing generally rigid rectangular cross-sectioned contact pins within an enclosure wall having an interior surface and an exterior surface which comprises the steps of:
   (a) forming at least one contact pin receiving bore within a thermoplastic enclosure wall, said bore extending a predetermined distance into said wall from said interior surface and having a tapered end thereon terminating a second predetermined distance short of the exterior surface of said enclosure wall, there being a slit, having a transverse dimension less than the corresponding transverse dimension of the contact pin to be received therethrough, extending from the apex of said tapered end of said bore to said exterior surface of said wall;
   (b) inserting a generally rigid contact pin into said bore with a portion thereof extending through said slit beyond said exterior surface of said wall, with the edges of said slit being in resilient engagement with the lateral edges of said generally rigid contact pin to form a lip seal thereabout; and
   (c) heating said generally rigid contact pin extension to a temperature sufficient to cause the material forming said thermoplastic wall to flow, thereby forming a seal about the edges of said generally rigid contact pin.

* * * * *